(12) United States Patent
Behringer et al.

(10) Patent No.: US 11,353,726 B2
(45) Date of Patent: Jun. 7, 2022

(54) OPTOELECTRONIC MODULE, METHOD FOR OPERATING AN OPTOELECTRONIC MODULE AND HEAD-MOUNTED DISPLAY

(71) Applicant: OSRAM Opto Semiconductors GmbH, Regensburg (DE)

(72) Inventors: Martin Rudolf Behringer, Regensburg (DE); Hubert Halbritter, Dietfurt (DE); Ann Russell, San Jose, CA (US)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 17/028,539

(22) Filed: Sep. 22, 2020

(65) Prior Publication Data
US 2022/0091444 A1 Mar. 24, 2022

(51) Int. Cl.
| G02F 1/01 | (2006.01) |
|---|---|
| G02F 1/19 | (2019.01) |
| H01S 5/40 | (2006.01) |
| H01S 5/028 | (2006.01) |

(52) U.S. Cl.
CPC ............ *G02F 1/011* (2013.01); *G02F 1/0121* (2013.01); *G02F 1/19* (2013.01); *H01S 5/028* (2013.01); *H01S 5/4012* (2013.01); *H01S 5/4087* (2013.01)

(58) Field of Classification Search
CPC .......... G02F 1/011; G02F 1/0121; G02F 1/19; H01S 5/028; H01S 5/4012; H01S 5/4087
See application file for complete search history.

(56) References Cited

U.S. PATENT DOCUMENTS

| 5,499,256 A * | 3/1996 | Bischel | H01S 5/141 372/12 |
|---|---|---|---|
| 7,235,150 B2 * | 6/2007 | Bischel | G02B 6/4204 156/212 |
| 7,653,109 B2 * | 1/2010 | Bischel | G02B 6/4201 372/50.12 |
| 10,796,627 B2 * | 10/2020 | Pan | G09G 3/32 |
| 2002/0110328 A1 * | 8/2002 | Bischel | H01S 5/02326 385/49 |
| 2004/0105611 A1 * | 6/2004 | Bischel | G02B 6/4232 385/14 |
| 2005/0046928 A1 * | 3/2005 | Bischel | G02B 6/4201 359/341.3 |
| 2007/0248139 A1 * | 10/2007 | Bischel | G02B 6/4204 372/75 |

* cited by examiner

*Primary Examiner* — Peter Radkowski
(74) *Attorney, Agent, or Firm* — MH2 Technology Law Group LLP

(57) ABSTRACT

An optoelectronic module comprising at least one semiconductor laser and a photonic chip is described herein. The semiconductor laser emits a primary electromagnetic radiation which is coupled into the photonic chip. The photonic chip comprises at least one first waveguide and at least one optical Bragg reflector having a reflectivity which is modulated by an electrical modulation signal. A secondary electromagnetic radiation is coupled out of the photonic chip by means of at least one second waveguide, wherein the secondary electromagnetic radiation has a dominant wavelength which is modulated in dependence of the electrical modulation signal. Further, a method for operating an optoelectronic module and a Head-Mounted Display comprising an optoelectronic module are provided.

22 Claims, 10 Drawing Sheets

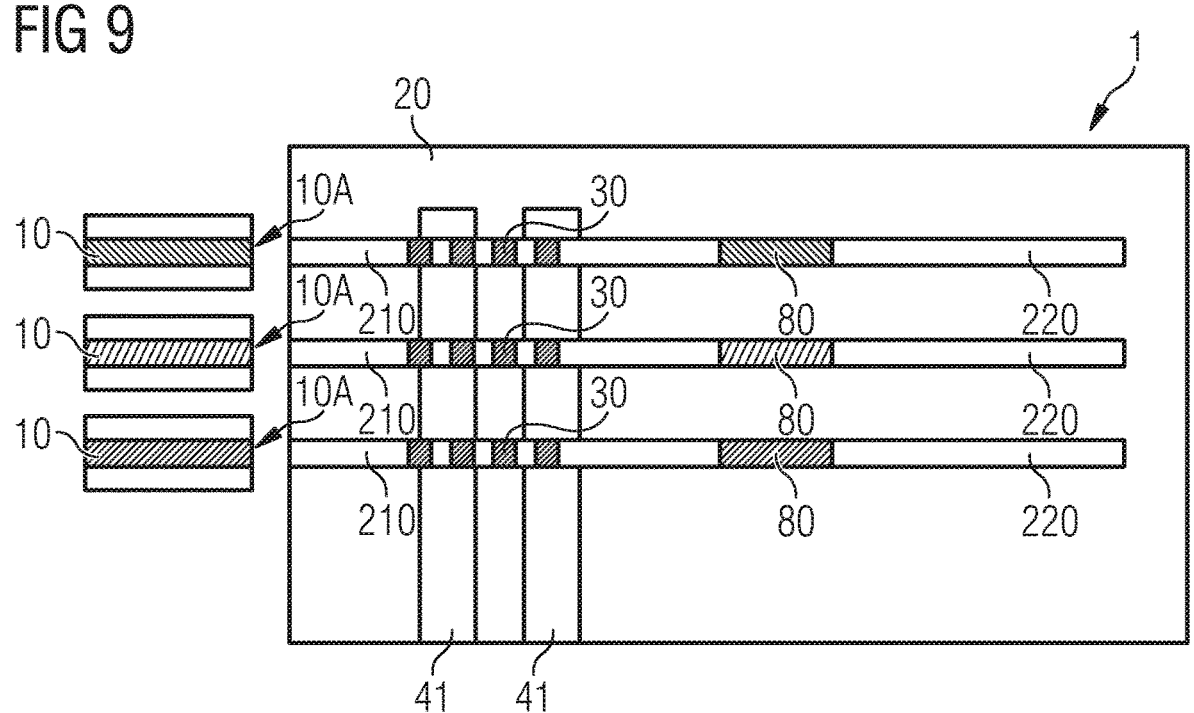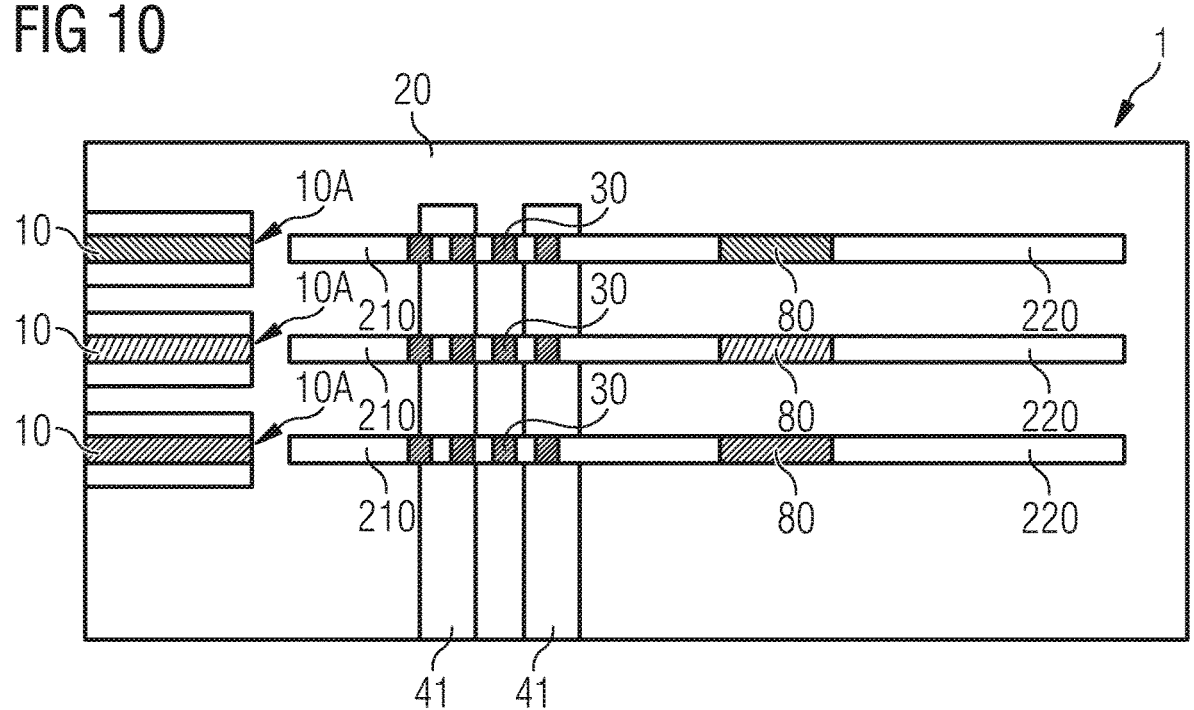

OPTOELECTRONIC MODULE, METHOD FOR OPERATING AN OPTOELECTRONIC MODULE AND HEAD-MOUNTED DISPLAY

FIELD

The present application relates to an optoelectronic module, a method for operating an optoelectronic module and a Head-Mounted Display.

It is an object to provide an optoelectronic module comprising improved optical characteristics.

SUMMARY

According to at least one embodiment of the optoelectronic module the optoelectronic module comprises at least one semiconductor laser and a photonic chip. A semiconductor laser is intended for the emission of a coherent electromagnetic radiation. A photonic chip preferably comprises a radiation permeable material and optical structures which are suitable for the manipulation of an electromagnetic radiation, for example a waveguide.

According to at least one embodiment of the optoelectronic module the semiconductor laser emits a primary electromagnetic radiation. The primary electromagnetic radiation is coupled into the photonic chip. The primary electromagnetic radiation comprises a dominant wavelength. The dominant wavelength of an electromagnetic radiation is the wavelength at which the spectrum of the electromagnetic radiation has the highest intensity.

According to at least one embodiment of the optoelectronic module the photonic chip comprises at least one first waveguide and at least one optical Bragg reflector having a reflectivity which is modulated by an electrical modulation signal. The first waveguide transfers the primary electromagnetic radiation from the semiconductor laser to the optical Bragg reflector. The first waveguide may comprise a material which is permeable for the primary electromagnetic radiation. For example, the first waveguide is at least partially surrounded by a material having a lower refractive index for the primary electromagnetic radiation than the material of the first waveguide itself. Thus, the primary electromagnetic radiation is confined within the waveguide and propagates along the first waveguide.

According to at least one embodiment of the optoelectronic module a secondary electromagnetic radiation is coupled out of the photonic chip by means of at least one second waveguide. The second waveguide is arranged downstream of the Bragg reflector. The secondary electromagnetic radiation has a dominant wavelength which is modulated in dependence of the electrical modulation signal. The modulation of the electrical modulation signal can be any time-dependent variation and does not necessarily have to be periodic.

The optoelectronic module preferably emits a secondary electromagnetic radiation which lies at least partially within a spectral range which is visible to the human eye.

According to at least one embodiment the optoelectronic module comprises at least one semiconductor laser and a photonic chip, wherein the semiconductor laser emits a primary electromagnetic radiation, the primary electromagnetic radiation is coupled into the photonic chip, the photonic chip comprises at least one first waveguide and at least one optical Bragg reflector having a reflectivity which is modulated by an electrical modulation signal, and a secondary electromagnetic radiation is coupled out of the photonic chip by means of at least one second waveguide, wherein the secondary electromagnetic radiation has a dominant wavelength which is modulated in dependence of the electrical modulation signal.

An optoelectronic module described herein is, inter alia, based on the following considerations: Semiconductor lasers emit a primary electromagnetic radiation which has a good beam quality, making them particularly suitable for use in Head-Mounted display units or projection devices. In addition to their good beam quality, semiconductor lasers also have a particularly small extension of an emission area that corresponds approximately to a point light source. This results in an advantageously high luminance, which can contribute to the miniaturization of optical systems. When using a semiconductor laser in a visible wavelength range, however, undesirable interference effects, for example in the form of speckles, can sometimes be perceived by an observer. These interference effects lead to uneven illumination and disturbing illumination patterns.

The optoelectronic module described herein is, among other things, based on the idea of generating a secondary electromagnetic radiation which has a varying dominant wavelength. The dominant wavelength of the secondary electromagnetic radiation can be modulated by means of a Bragg reflector whose reflectivity can be varied by means of an electrical modulation signal. Furthermore, by superimposing a plurality of primary electromagnetic radiations of a plurality of semiconductor lasers, a secondary electromagnetic radiation with an increased secondary spectral bandwidth can be generated. By varying the dominant wavelength of the secondary electromagnetic radiation, an increase in spectral bandwidth and a decrease in coherence length can be achieved. A less coherent radiation advantageously reduces the intensity of any unwanted interference effects. This has the advantage of reducing or eliminating the appearance of speckles.

According to at least one embodiment of the optoelectronic module the semiconductor laser has a front facet which is covered with an anti-reflection coating. The anti-reflection coating decreases the amount of radiation which is reflected back at the front facet and thus cannot be coupled out of the semiconductor laser. Preferably the front facet has a reflectivity for the primary electromagnetic radiation of at most 10%, preferably of at most 1% and particularly preferably of at most 0.001%. A low reflectivity of the front facet improves an efficiency of the optoelectronic module. Furthermore, if a reflectivity of the front facet is lowered, the optical feedback for the semiconductor laser is advantageously dominated by the modulated reflectivity of the Bragg reflector.

According to at least one embodiment of the optoelectronic module the primary electromagnetic radiation has a primary spectral bandwidth, and the secondary electromagnetic magnetic radiation has a secondary spectral bandwidth which is larger than the primary spectral bandwidth and which is controlled by the electrical modulation signal. A higher spectral bandwidth results in a decreased coherence of the electromagnetic radiation and thus decreases or eliminates disturbing optical interference effects, like speckles.

According to at least one embodiment of the optoelectronic module the dominant wavelength of the primary electromagnetic radiation and of the secondary electromagnetic radiation is in the visible spectral range. Here and in the following the visible spectral range shall be defined as the spectral range of wavelength being equal to or greater than 380 nm and being equal to or smaller than 780 nm.

According to at least one embodiment of the optoelectronic module the optoelectronic module comprises a plurality of semiconductor lasers, first waveguides and Bragg reflectors, wherein a first waveguide and a Bragg reflector are assigned to each semiconductor laser. The use of a plurality of semiconductor lasers can increase the power output. The power output of the optoelectronic module can thus easily be made scalable. For instance, a broad spectral range can be covered by an optoelectronic module which uses a plurality of different semiconductor lasers, wherein each semiconductor laser emits a primary electromagnetic radiation having a different dominant wavelength.

According to at least one embodiment of the optoelectronic module the semiconductor lasers are monolithically integrated. Preferably, all semiconductor lasers of the optoelectronic module are monolithically integrated. A monolithically integrated component can for example be a multi-ridge element which comprises a multiplicity of laser ridges integrated into one single semiconductor body. This facilitates an arrangement of the semiconductor lasers with a small lateral distance from each other. A lateral distance is a distance parallel to a main extension plane of the optoelectronic module.

According to at least one embodiment of the optoelectronic module the second waveguides extend to a side face of the photonic chip and are arranged within a lateral distance of less than 10 μm to each other at the side face of the photonic chip. An arrangement of the second waveguides in a small lateral distance at the side face of the photonic chip ensures a particularly small emission region. Such an arrangement is advantageous for focusing and a projection of the secondary electromagnetic radiation.

According to at least one embodiment of the optoelectronic module the second waveguide is a beam combiner which couples the secondary electromagnetic radiation of the semiconductor lasers in a common waveguide with a common output facet. Preferably, the second waveguide is a beam combiner which couples the secondary electromagnetic radiation of each semiconductor lasers in a common waveguide with a common output facet. Such a design allows for example the projection of a single RGB pixel by superposition of the primary electromagnetic radiation of several semiconductor lasers and simplifies a projection of the secondary electromagnetic radiation via optics arranged downstream of the common output facet.

According to at least one embodiment of the optoelectronic module the optoelectronic module comprises at least three different semiconductor lasers wherein each semiconductor laser emits primary electromagnetic radiation having a different dominant wavelength. For example, one semiconductor laser emits a primary electromagnetic radiation having a dominant wavelength in the spectral region of red light, one semiconductor laser emits a primary electromagnetic radiation having a dominant wavelength in the spectral region of green light and one semiconductor laser emits a primary electromagnetic radiation having a dominant wavelength in the spectral region of blue light. Such an arrangement allows manufacturing an RGB optoelectronic module which is capable of emitting a primary electromagnetic radiation having any desired color that lies within a color triangle that is spanned by the three different dominant wavelengths.

According to at least one embodiment of the optoelectronic module the semiconductor laser is arranged on the photonic chip. The arrangement of a semiconductor laser on the photonic chip facilitates an alignment of the semiconductor laser with respect to the first waveguide. Furthermore, temperature dependent misalignments can be decreased or avoided and a mechanical stability can be improved.

According to at least one embodiment of the optoelectronic module a region extending from the front facet to the first waveguide is filled with a filler material which is permeable for the primary electromagnetic radiation. The filler material can protect the front facet from deteriorating environmental influences. Thus, advantageously no hermetical encapsulation of the front facet is necessary. For example, the filler material comprises a silicone or epoxy material.

According to at least one embodiment of the optoelectronic module the first waveguide, the second waveguide and/or the Bragg reflector are made of one of the following materials: LiNb, ITO, SiN, SiO, liquid crystal-materials. Preferably, the first waveguide, the second waveguide and the Bragg reflector are made of one of these materials. The refractive index of ITO depends on an electric current flowing through it. The refractive index of LiNb, SiN, SiO and liquid crystal-materials depends on an electric voltage attached to it. Consequently the refractive indices of these materials can advantageously be modulated by using an electric modulation signal.

According to at least one embodiment of the optoelectronic module the first waveguide is a single mode waveguide. A single mode waveguide only allows the propagation of the transverse mode. Advantageously this results in a particularly homogenous beam intensity profile.

According to at least one embodiment of the optoelectronic module the first waveguide is tapered starting from the front facet towards the Bragg reflector. The tapering can increase an incoupling efficiency for the primary electromagnetic radiation which is generated in the semiconductor laser. For example, the first waveguide has a larger diameter at the end facing towards the semiconductor laser, and the diameter decreases with an increasing distance from the semiconductor laser.

According to at least one embodiment of the optoelectronic module the photonic chip comprises a substrate which is made from silicon, glass or sapphire and preferably provides mechanical stability. These substrate materials can be made particularly pure and thus used particularly well for the growth of additional layers.

According to at least one embodiment of the optoelectronic module the photonic chip comprises at least one optical modulator downstream of the Bragg reflector. The optical modulator can be used to modulate an intensity of the secondary electromagnetic radiation. Consequently, a pulse length of the secondary electromagnetic radiation can be adjusted. This is especially advantageous if the semiconductor laser should be operated in a continuous mode. Preferably the optical modulator is a Mach-Zehnder-modulator.

According to at least one embodiment of the optoelectronic module the photonic chip comprises an optical deflector which deflects the secondary electromagnetic radiation out of the main extension plane of the photonic chip. Preferably the optical deflector deflects the secondary electromagnetic radiation in a vertical direction, particularly preferably in in a direction perpendicular to the main extension plane of the photonic chip. For example the optical deflector is a prism, a grating or a diffractive META-optic component. The optical deflector may be arranged directly on the photonic chip. The direct arrangement of the deflector on the photonic chip provides for a particularly compact optoelectronic module.

According to at least one embodiment of the optoelectronic module each Bragg reflector is electrically connected to a common electrical potential or each Bragg reflector is electrically connected to an individual electrical potential. For example, each Bragg reflector comprises first electrical terminals which are preferably connected to different electrical potentials. Bragg reflectors which are individually electrically connected can be configured to be controlled simultaneously or to be controlled individually.

According to at least one embodiment of the optoelectronic module the front facet is slanted at an angle between 2° and 32° inclusive with respect to a main extension direction of the semiconductor chip or an incoupling facet of the first waveguide is slanted at an angle between 2° and 32° inclusive with respect to a main extension direction of the first waveguide. The main extension direction is parallel to a main emission direction of the semiconductor laser. The incoupling facet is an end surface of the first waveguide facing towards the semiconductor laser. Preferably, the primary electromagnetic radiation is mainly coupled into the first waveguide through the incoupling facet.

By slanting the front facets of the semiconductor laser and/or the incoupling facet of the first waveguide a reflection of the impinging primary electromagnetic radiation back into the semiconductor laser can advantageously be decreased or prevented. For example, part of the electromagnetic radiation is reflected back in such a way that it gains little or no further optical amplification. This can be helpful to suppress amplification of any unwanted side modes.

Preferably, the front facet and/or the incoupling facet is slanted according to a Brewster Angle for the primary electromagnetic radiation in order to minimize a reflectivity of the front facet and/or the incoupling facet.

According to at least one embodiment of the optoelectronic module the photonic chip comprises a photodiode, wherein part of the secondary electromagnetic radiation impinges on said photodiode. Preferably 10% or less of the secondary electromagnetic radiation are impinging on the photodiode.

The photodiode can be used to monitor the optical power of the semiconductor lasers.

According to at least one embodiment of the optoelectronic module the photodiode is realized by introducing Ge or Si in the second waveguide.

According to at least one embodiment of the optoelectronic module the module comprises a wave plate downstream of the photonic chip to alter the polarization state of the secondary electromagnetic radiation.

According to at least one embodiment of the optoelectronic module the module comprises a collimation optic downstream of the photonic chip to collimate the secondary electromagnetic radiation.

According to at least one embodiment of the optoelectronic module the photonic chip comprises at least one semiconductor optical amplifier (SOA).

The aforementioned exemplary embodiments, features and properties of a semiconductor laser relate both to optoelectronic modules with a single semiconductor laser and to modules with a plurality of semiconductor lasers. Furthermore, the disclosed features and properties can be implemented in all or only in some of the semiconductor lasers.

The aforementioned exemplary embodiments, features and properties of a first waveguide relate both to optoelectronic modules with a single first waveguide and to modules with a plurality of first waveguides. Furthermore, the disclosed features and properties can be implemented in all or only in some of the first waveguides.

The aforementioned exemplary embodiments, features and properties of a second waveguide relate both to optoelectronic modules with a single second waveguide and to modules with a plurality of second waveguides. Furthermore, the disclosed features and properties can be implemented in all or only in some of the second waveguides.

The aforementioned exemplary embodiments, features and properties of a Bragg reflector relate both to optoelectronic modules with a single Bragg reflector and to modules with a plurality of Bragg reflectors. Furthermore, the disclosed features and properties can be implemented in all or only in some of the Bragg reflectors.

A method for operating an optoelectronic module is also disclosed. The method for operating an optoelectronic module is particularly suitable for operating an optoelectronic module described here. This means that all features disclosed in connection with the optoelectronic module are also disclosed for the method for operating the optoelectronic module and vice versa.

According to at least one embodiment of the method for operating an optoelectronic module the Bragg reflector modulates the dominant wavelength of the secondary electromagnetic radiation with a modulation rate of at least 2 nm per ns. A high modulation rate allows for a significant increase of a spectral bandwidth in the secondary electromagnetic radiation without disturbing a perception of the emitted light for a human viewer by flickering for example.

According to at least one embodiment of the method for operating an optoelectronic module the Bragg reflector modulates the dominant wavelength of the secondary electromagnetic radiation within a spectral range of at least 10 nm. By varying the dominant wavelength of the secondary electromagnetic radiation within a spectral range of at least 10 nm a coherence length of the secondary electromagnetic radiation is advantageously reduced.

A Head-Mounted Display comprising an optoelectronic module is also disclosed. The Head-Mounted Display is particularly suitable for using an optoelectronic module described herein. This means that all features disclosed in connection with the optoelectronic module are also disclosed for the Head-Mounted Display and vice versa. A Head-Mounted Display is for example a near eye display, a Head-Up Display or a Virtual-Reality Headset.

An optoelectronic module described herein is particularly suitable for use in so-called "smart eyewear products" with which augmented reality (AR), or virtual reality (VR) units are realized. The optoelectronic module described herein can also be used in various projection systems for displaying image content, for example in glasses, close to the eye or for direct projection of an image into a human eye.

Further advantages and advantageous designs and further developments of the optoelectronic module result from the following exemplary embodiments, which are described below in association with the figures.

BRIEF DESCRIPTION OF DRAWINGS

FIG. 9 shows a schematic plan view of an optoelectronic module described herein according to a ninth exemplary embodiment, FIG. 10 shows a schematic plan view of an optoelectronic module described herein according to a tenth exemplary embodiment.

DETAILED DESCRIPTION

Identical, similar or equivalent elements are marked with the same reference signs in the figures. The figures and the proportions of the elements represented in the figures among each other are not to be considered as true to scale. Rather, individual elements may be oversized for better representability and/or comprehensibility.

Figure 1:
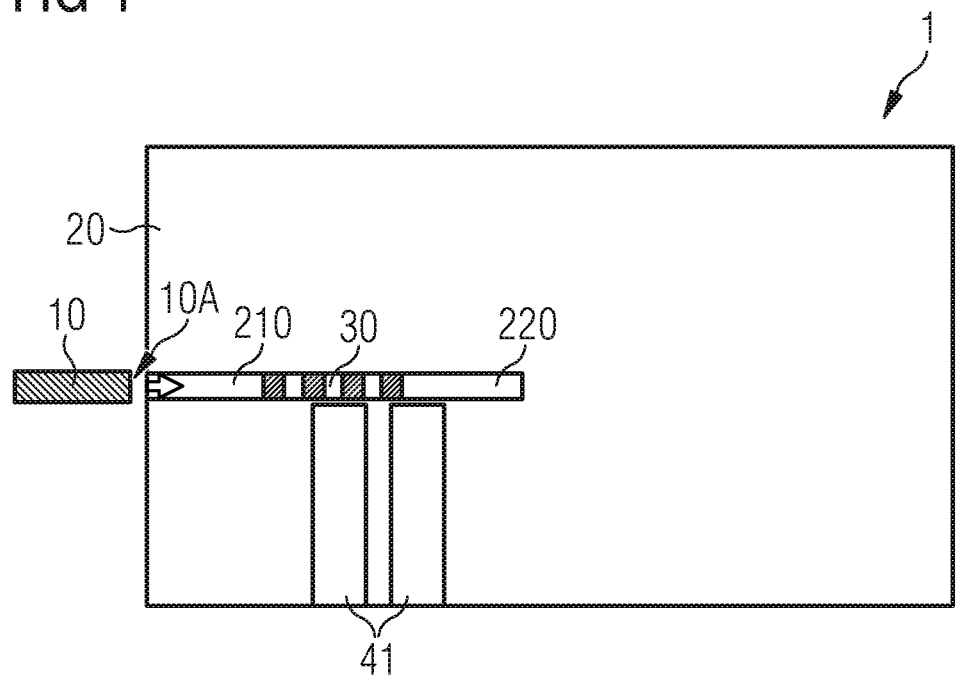
FIG. 1 shows a schematic plan view of an optoelectronic module described herein according to a first exemplary embodiment.

FIG. 1 shows a schematic plan view of an optoelectronic module 1 according to the first exemplary embodiment. The optoelectronic module 1 comprises a semiconductor laser 10 and a photonic chip 20. The photonic chip 20 has a first waveguide 210, a Bragg reflector 30 and a second waveguide 220.

The semiconductor laser 10 emits a primary electromagnetic radiation having a dominant wavelength through a front facet 10A. The front facet 10A is a smooth surface of the semiconductor laser 10 which is facing the photonic chip 20. The first waveguide 210 is made from a material which is permeable for the primary electromagnetic radiation. The first waveguide 210 has a higher refractive index than the material which surrounds the first waveguide 210. The first waveguide 210 extends from a side face 20A of the photonic chip to the Bragg reflector 30. The second waveguide 220 is arranged downstream of the Bragg reflector 30.

The Bragg reflector 30 comprises a plurality of periodically arranged layers having alternating refractive indices. This results in a reflectivity according to the refractive indices and the pitch of the periodically arranged layers. The reflectivity of the Bragg reflector 30 can be modulated by an electric current or an electric voltage which is applied to the Bragg reflector 30. A first electrical terminal 41 is arranged on the photonic chip 20 in order to supply the Bragg reflector 30 with an electrical modulation signal which modulates the reflectivity of the Bragg reflector 30.

The primary electromagnetic radiation is coupled into the first waveguide 210 on the photonic chip 20 and propagates along the main extension direction of the first waveguide 210 to the Bragg reflector 30. According to the reflectivity of the Bragg reflector 30 depending on the electric modulation signal supplied via the first electrical terminal 41, a part of the primary electromagnetic radiation is reflected towards the semiconductor laser 10 and a part is transmitted as a secondary electromagnetic radiation to the second waveguide 220 downstream of the Bragg reflector 30.

Figure 2:
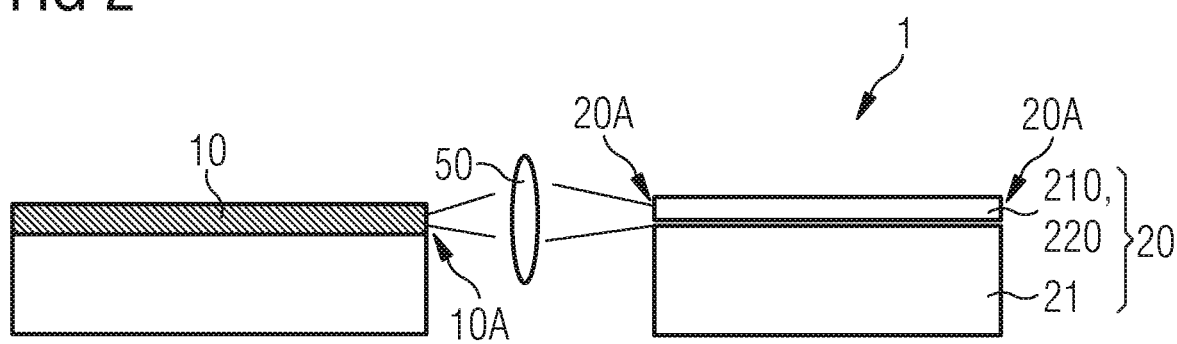
FIG. 2 shows a schematic side view of an optoelectronic module described herein according to a second exemplary embodiment.

FIG. 2 shows a side view of an optoelectronic module 1 according to the second exemplary embodiment. The optoelectronic module 1 comprises a semiconductor laser 10, a photonic chip 20 and a coupling optic 50. The semiconductor laser 10 emits a primary electromagnetic radiation through a front facet 10A. The coupling optic 50 is arranged between the semiconductor laser 10 and the photonic chip 20. The primary electromagnetic radiation is guided to a side face 20A of the photonic chip 20 by means of the coupling optic 50. The coupling optic 50 can comprise lenses, optical fibres and optical connectors, for example. Thus, the semiconductor laser 10 does not necessarily have to be arranged in the direct vicinity of the photonic chip 20.

The photonic chip 20 has a substrate 21 made from silicon, sapphire or glass on which a first waveguide 210 and a second waveguide 220 are arranged. The first and second waveguides 210, 220 are made of LiNb, ITO, SiN, SiO or liquid crystal-materials.

Figure 3:
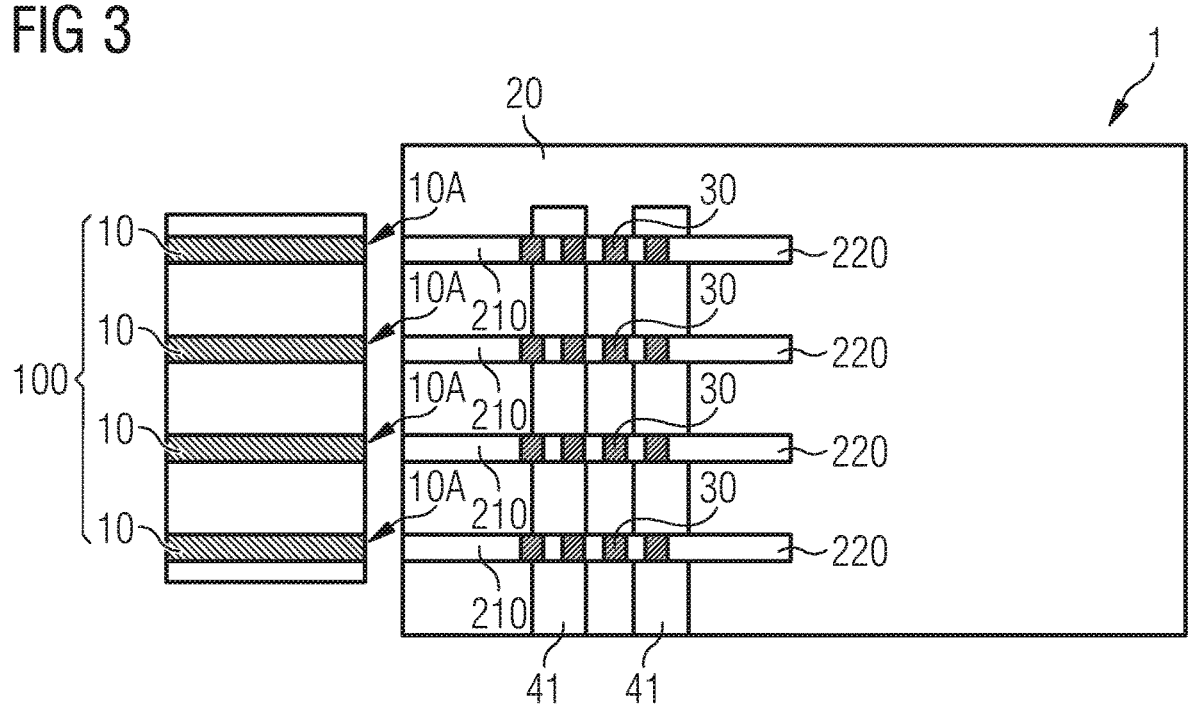
FIG. 3 shows a schematic plan view of an optoelectronic module described herein according to a third exemplary embodiment.

FIG. 3 shows a schematic plan view of the third exemplary embodiment of an optoelectronic module 1. The optoelectronic module 1 comprises a plurality of semiconductor lasers 10 which are monolithically integrated. All semiconductor lasers 10 are made from one continuous semiconductor body 100.

The photonic chip 20 comprises a plurality of first waveguides 210, Bragg reflectors 30 and second waveguides 220. A first waveguide 210 and a Bragg reflector 30 are assigned to each semiconductor laser 10. To each Bragg reflector 30 a second waveguide 220 is assigned. The optical output power of the optoelectronic module 1 is increased by using a plurality of semiconductor lasers 10.

All Bragg reflectors 30 are connected to a first electrical terminal 41. The reflectivity of the Bragg reflectors 30 can be simultaneously modulated by means of the first electrical terminal 41.

Figure 4:
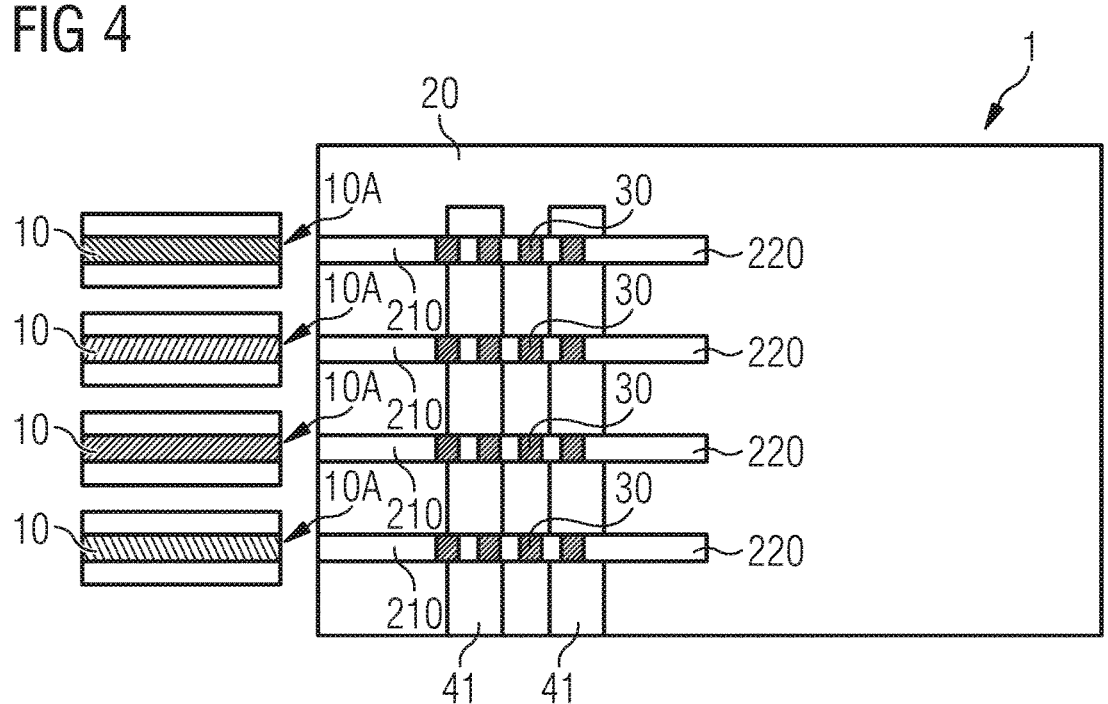
FIG. 4 shows a schematic plan view of an optoelectronic module described herein according to a fourth exemplary embodiment.

FIG. 4 shows a schematic plan view of an optoelectronic module 1 according to the fourth exemplary embodiment. The fourth exemplary embodiment essentially corresponds to the third exemplary embodiment. In contrast to the third exemplary embodiment, the optoelectronic module 1 in FIG. 4 comprises a plurality of semiconductor lasers 10 which are not monolithically integrated. Each semiconductor laser 10 is intended to emit a primary electromagnetic radiation having a different dominant wavelength.

A first semiconductor laser 10 is intended to emit a primary electromagnetic radiation having a dominant wavelength in the red spectral region, a second semiconductor laser 10 is intended to emit a primary electromagnetic radiation having a dominant wavelength in the green spectral region, a third semiconductor laser 10 is intended to emit a primary electromagnetic radiation having a dominant wavelength in the blue spectral region, and a fourth semiconductor laser 10 is intended to emit a primary electromagnetic radiation having a dominant wavelength in the orange spectral region. Thus, the emission of all semiconductor lasers 10 can be used to mix electromagnetic radiation in order to achieve a desired color output.

To increase an optical output power, each semiconductor laser 10 can be replaced by a semiconductor body 100 having a plurality of monolithically integrated semiconductor lasers 10.

Figure 5:
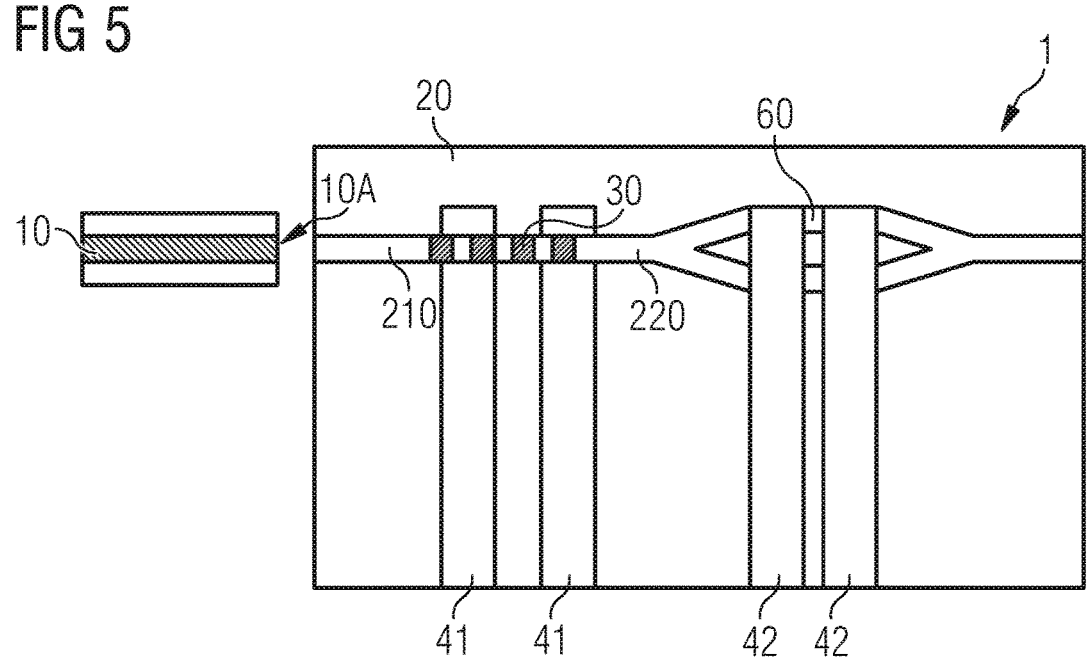
FIG. 5 shows a schematic plan view of an optoelectronic module described herein according to a fifth exemplary embodiment.

FIG. 5 describes a schematic plan view of an optoelectronic module 1 according to the fifth exemplary embodiment. The fifth exemplary embodiment essentially corresponds to the first exemplary embodiment. Additionally to the first exemplary embodiment, the optoelectronic module 1 in FIG. 5 comprises an optical modulator 60 and a second electrical terminal 42. The optical modulator 60 is for example a Mach-Zehnder modulator which is suitable for the modulation of a secondary electromagnetic radiation in phase and/or intensity. This can advantageously allow a continuous operating mode of the semiconductor laser 10 and increase a maximum modulation frequency of the secondary electromagnetic radiation. The optical modulator 60 can be modulated by an electrical modulation signal applied to the second electric terminal 42.

Figure 6:
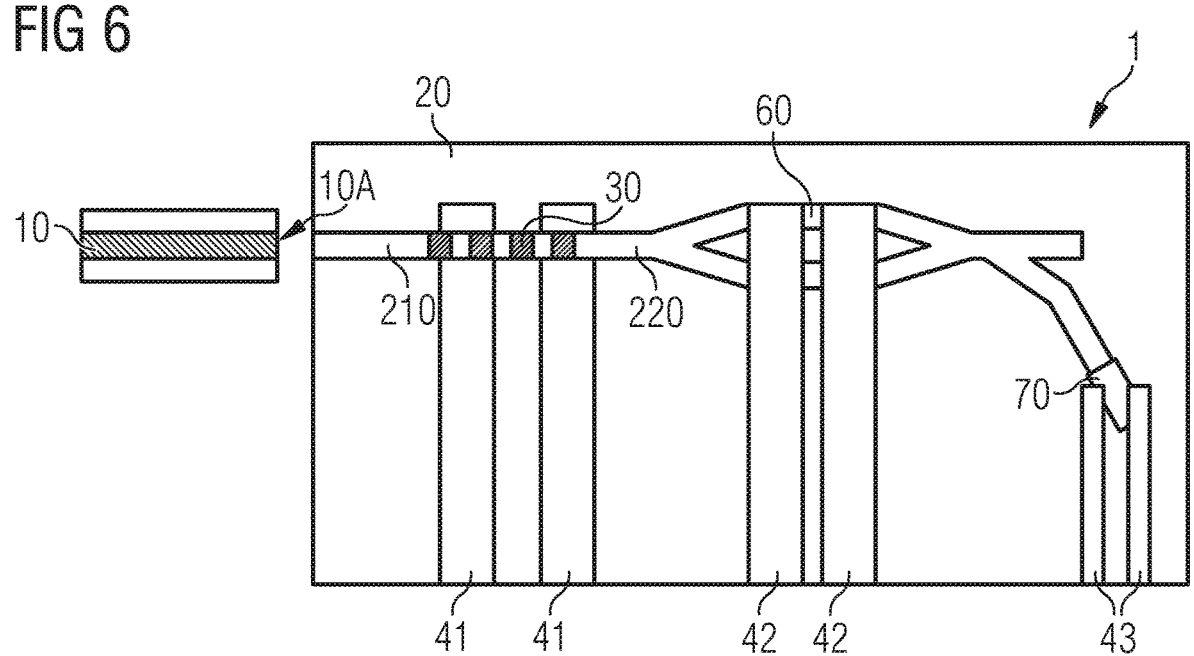
FIG. 6 shows a schematic plan view of an optoelectronic module described herein according to a sixth exemplary embodiment.

FIG. 6 shows a schematic plan view of an optoelectronic module 1 according to the sixth exemplary embodiment. The sixth exemplary embodiment essentially corresponds to the fifth exemplary embodiment. In addition to the fifth exemplary embodiment, the optoelectronic module in FIG. 6 comprises an optical detector 70. The optical detector 70 receives less than 10% of the secondary electromagnetic radiation. The optical detector 70 is for example a photodiode which monitors the optical output power of the semiconductor laser 10. The optical detector 70 can be manufactured by simply introducing Ge or Si in the photonic chip 20. An electrical current or voltage can be measured at third electrical terminals 43 which are connected to the optical detector 70.

Figure 7:
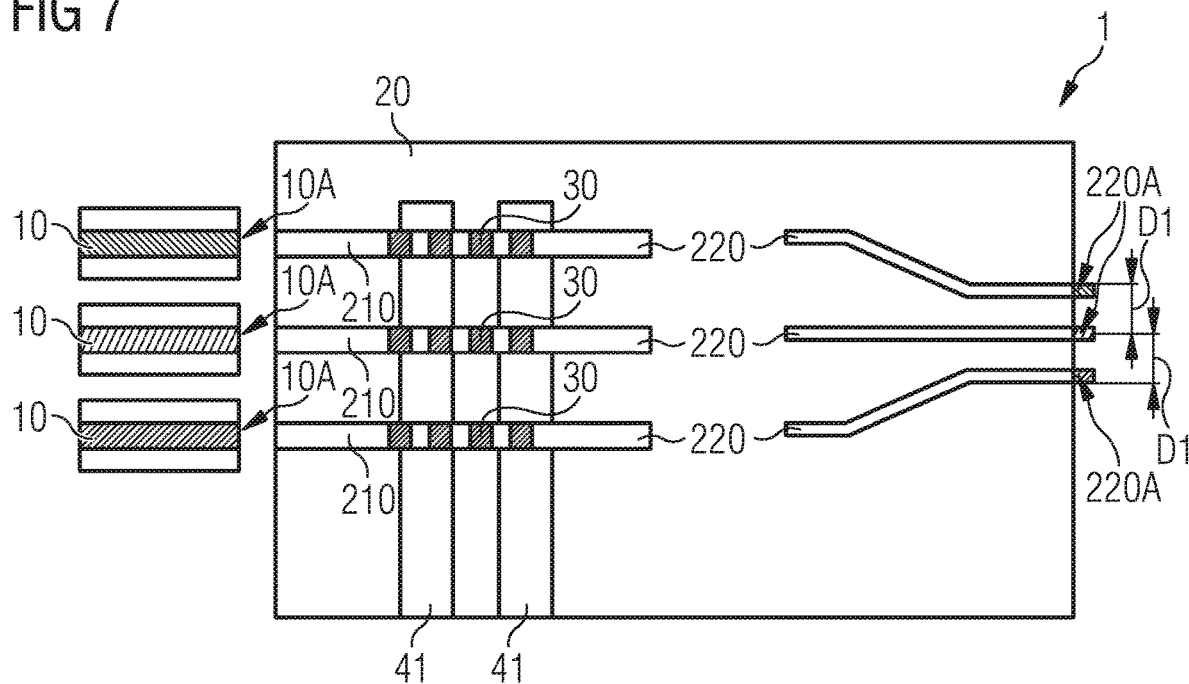
FIG. 7 shows a schematic plan view of an optoelectronic module described herein according to a seventh exemplary embodiment.

FIG. 7 illustrates a schematic plan view of an optoelectronic module 1 according to the seventh exemplary embodiment. The optoelectronic module 1 comprises three different semiconductor lasers 10 and a photonic chip 20, wherein each semiconductor laser 10 has a front facet 10A. The photonic chip 20 comprises three first waveguides 210, three Bragg reflectors 30 and three second waveguides 220. A first waveguide 210, a Bragg reflector 30 and a second waveguide 220 are each assigned to one of the semiconductor lasers 10. A first electric terminal 41 is connected to each of the Bragg reflectors 30 to modulate the reflectivity of the Bragg reflectors 30 by an electric modulation signal.

A secondary electromagnetic radiation is coupled out of the photonic chip 20 by means of the second waveguides 220. Every second waveguide 220 has an output facet 220A at a side face 20A of the photonic chip 20. The output facets 220A are arranged at a lateral distance D1 from each other. The lateral distance D1 is less than 10 µm. This simplifies a further projection and/or collimation of the secondary electromagnetic radiation by optical elements which are arranged downstream of the photonic chip 20.

Figure 8:
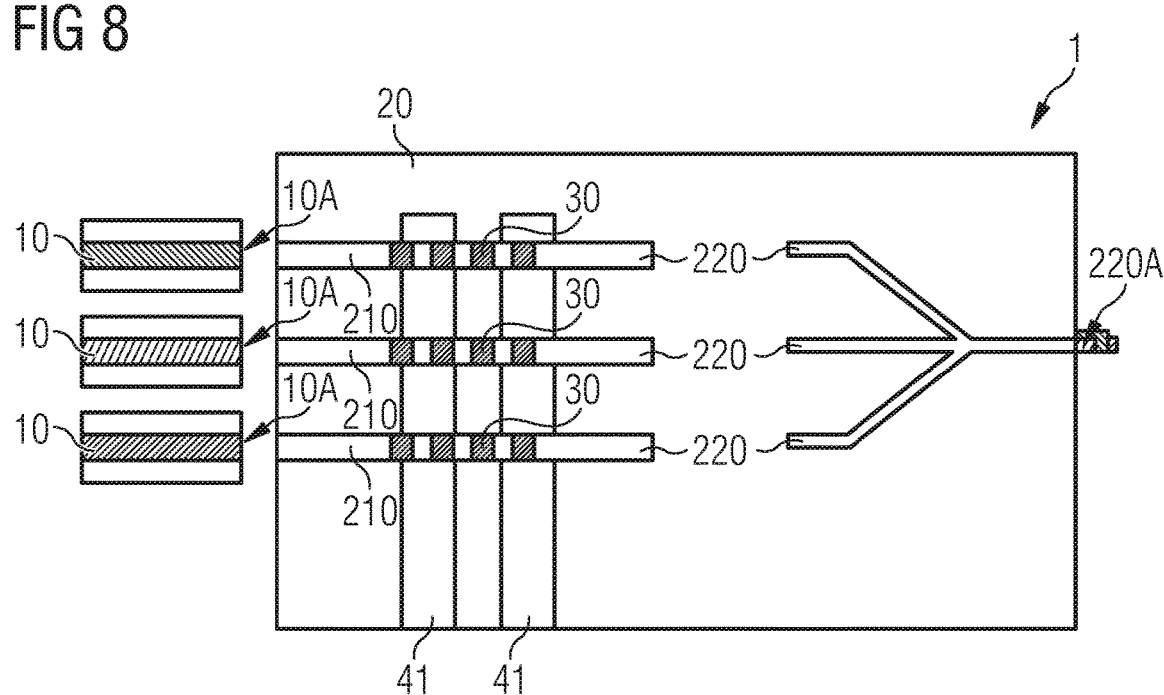
FIG. 8 shows a schematic plan view of an optoelectronic module described herein according to an eighth exemplary embodiment.

FIG. 8 describes a schematic plan view of an optoelectronic module 1 according to the eighth exemplary embodiment. The eighth exemplary embodiment essentially corresponds to the seventh exemplary embodiment. In contrast to the seventh exemplary embodiment, the second waveguides 220 in FIG. 8 form a beam combiner which couples the secondary electromagnetic radiation of the semiconductor lasers 10 in a common waveguide with a common output facet 220A. Such a design allows the projection of a single RGB pixel by superposition of the primary electromagnetic radiation of several semiconductor lasers 10 having different dominant wavelengths. The further collimation and/or deflection of such a light source is advantageously simplified. Because of the small lateral dimension of the common output facet 220A it is very similar to a point light source.

FIG. 9 shows a schematic plan view of an optoelectronic module 1 according to the ninth exemplary embodiment. The ninth exemplary embodiment essentially corresponds to the seventh exemplary embodiment. Additionally to the seventh exemplary embodiment, the photonic chip 20 in FIG. 9 comprises a plurality of semiconductor optical amplifiers 80 or SOAs. On each second waveguide 220 a semiconductor optical amplifier 80 is arranged. By means of a semiconductor optical amplifier 80 an electromagnetic radiation can be amplified to a desired level.

Each of the semiconductor optical amplifiers 80 is suitable for the amplification of a secondary electromagnetic radiation with a different dominant wavelength. The semiconductor optical amplifier 80 for blue and green emission is based on InGaN and directly grown on a sapphire- or GaN-substrate or the photonic chip 20. The semiconductor optical amplifier 80 for the amplification of a red emission is built as a so-called µSOA, which is grown on a different growth substrate and subsequently attached to the photonic chip 20.

FIG. 10 illustrates a schematic plan view of an optoelectronic module 1 according to the tenth exemplary embodiment. The tenth exemplary embodiment essentially corresponds to the ninth exemplary embodiment. In contrast to the ninth exemplary embodiment, the semiconductor lasers 10 are arranged on the photonic chip 20. Thus, the photonic chip 20 serves as a mechanically stable mounting platform for the semiconductor lasers 10.

The arrangement of the semiconductor lasers 10 on the photonic chip 20 enables a method for manufacturing an optoelectronic module 1 wherein the semiconductor lasers 10 are arranged on the photonic chip 20 before first waveguides 210 are introduced into the photonic chip 20. This allows for an individual alignment of the first waveguides 210 with respect to each semiconductor laser 10. The waveguides 210 can be manufactured by using a photolithography technique which can be performed with a very high precision. For example a lateral misalignment of a first waveguide 210 with respect to a semiconductor laser 10 can be less than 1 µm, preferably less than 0.1 µm.

Figure 11:
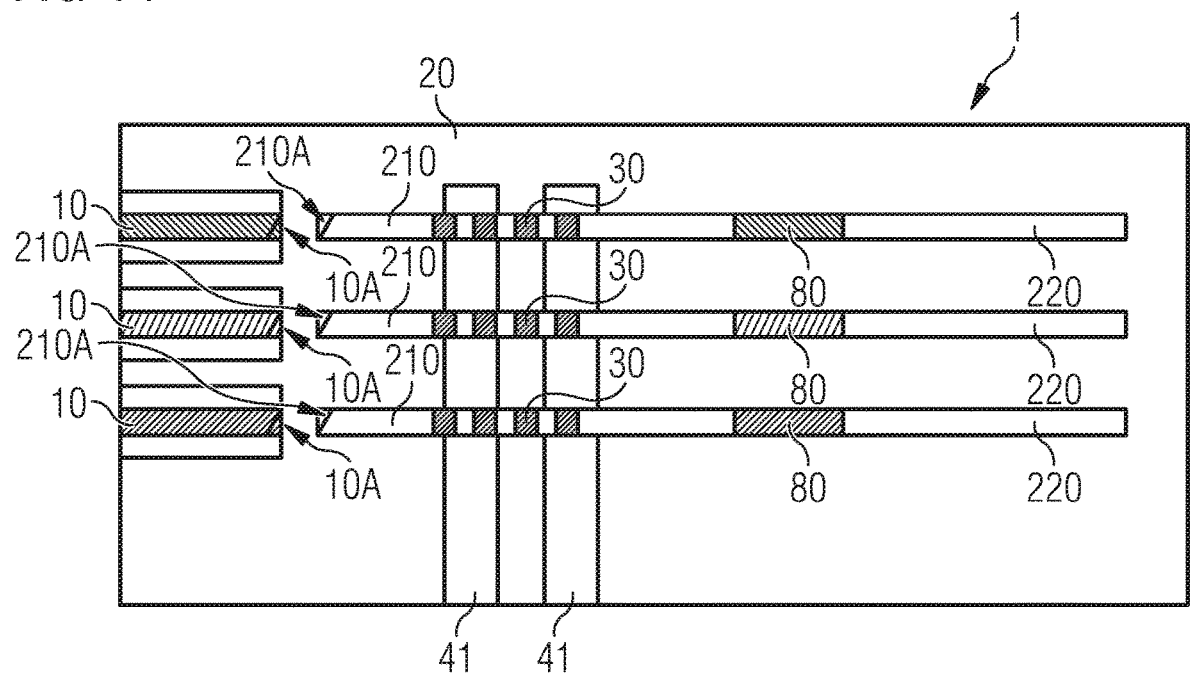
FIG. 11 shows a schematic plan view of an optoelectronic module described herein according to an eleventh exemplary embodiment.

FIG. 11 shows a schematic plan view of an optoelectronic module 1 according to the eleventh exemplary embodiment. The eleventh exemplary embodiment essentially corresponds to the tenth exemplary embodiment. In addition to the tenth exemplary embodiment, the front facets 10A of the semiconductor lasers 10 are slanted by an angle between 2° and 32° with respect to the main extension direction of the semiconductor laser 10. Furthermore, the first waveguides 210 comprise incoupling facets 210A which are also slanted by an angle between 2° to 32° with respect to a main extension direction of the first waveguides 210. Preferably the front facets 10A and/or the incoupling facets 210A are slanted at an angle which corresponds to the Brewster angle for the primary electromagnetic radiation in order to minimize a reflectivity.

Figure 12:
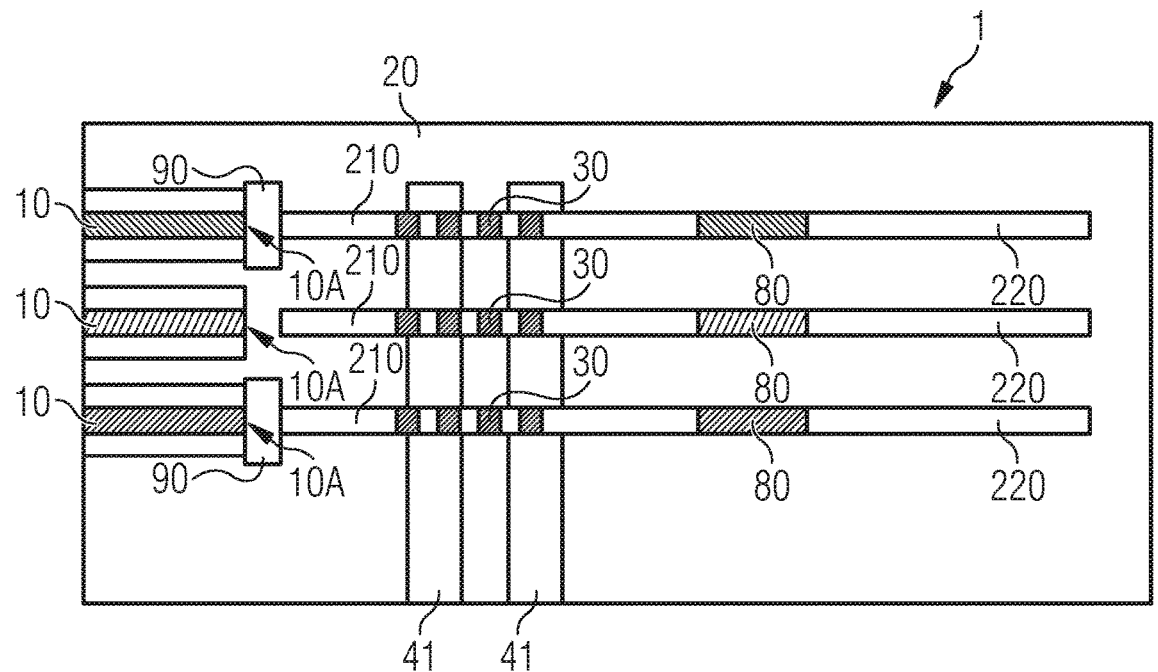
FIG. 12 shows a schematic plan view of an optoelectronic module described herein according to a twelfth exemplary embodiment.

FIG. 12 displays a schematic plan view of an optoelectronic module 1 according to the twelfth exemplary embodiment. The twelfth exemplary embodiment essentially corresponds to the tenth exemplary embodiment. In addition to the tenth exemplary embodiment, a filler material 90 is arranged between the front facet 10A of some of the semiconductor lasers 10 and the first waveguides 210. The filler material 90 is permeable for the primary electromagnetic radiation emitted by the semiconductor lasers 10. The filler material 90 protects the front facet 10A from deteriorating environmental influences. Thus, advantageously no hermetical encapsulation of the front facet 10A is necessary. The filler material 90 comprises a silicone or an epoxy material. Moreover, the filler material 90 can comprise a refractive index which is between the refractive index of the semiconductor laser 10 and the refractive index of the first waveguide 210 to improve a coupling efficiency of the primary electromagnetic radiation.

Figure 13:
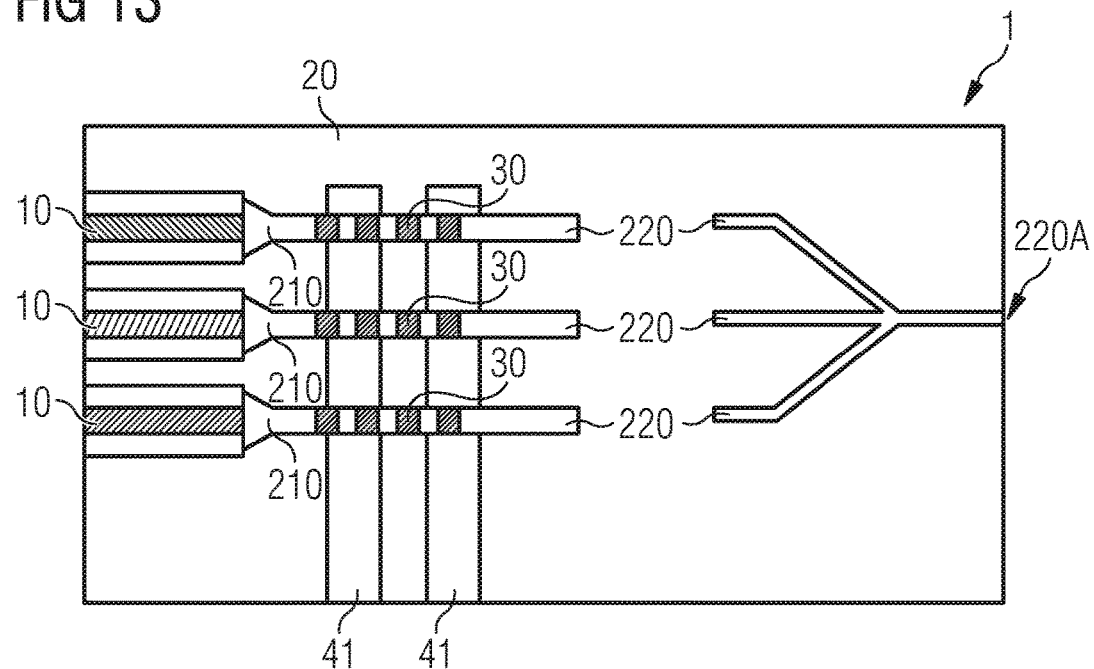
FIG. 13 shows a schematic plan view of an optoelectronic module described herein according to a thirteenth exemplary embodiment.

FIG. 13 describes a schematic plan view of an optoelectronic module 1 according to the thirteenth exemplary embodiment. The thirteenth exemplary embodiment essentially corresponds to the tenth exemplary embodiment. In addition to the tenth exemplary embodiment, the first waveguides 210 in FIG. 13 are tapered. The diameter of the first waveguides 210 is decreasing with an increasing distance from the semiconductor lasers 10. This allows for an improved coupling efficiency of the primary electromagnetic radiation.

Figure 14:
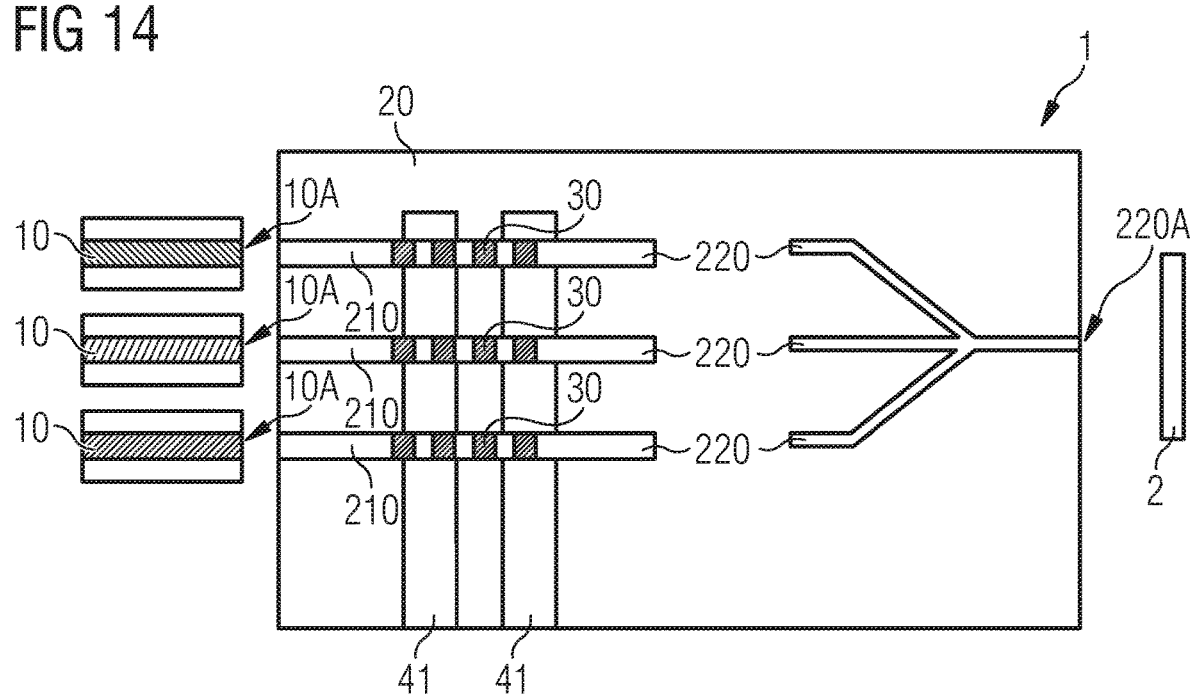
FIG. 14 shows a schematic plan view of an optoelectronic module described herein according to a fourteenth exemplary embodiment.

FIG. 14 shows a schematic plan view of an optoelectronic module 1 according to the fourteenth exemplary embodiment. The fourteenth exemplary embodiment essentially corresponds to the eighth exemplary embodiment. In addition to the eight exemplary embodiment, an optical element 2 is arranged downstream of the output facet 220A of the photonic chip 20. The optical element 2 is for example designed to collimate the secondary electromagnetic radiation coupled out of the output facet 220A.

Figure 15:
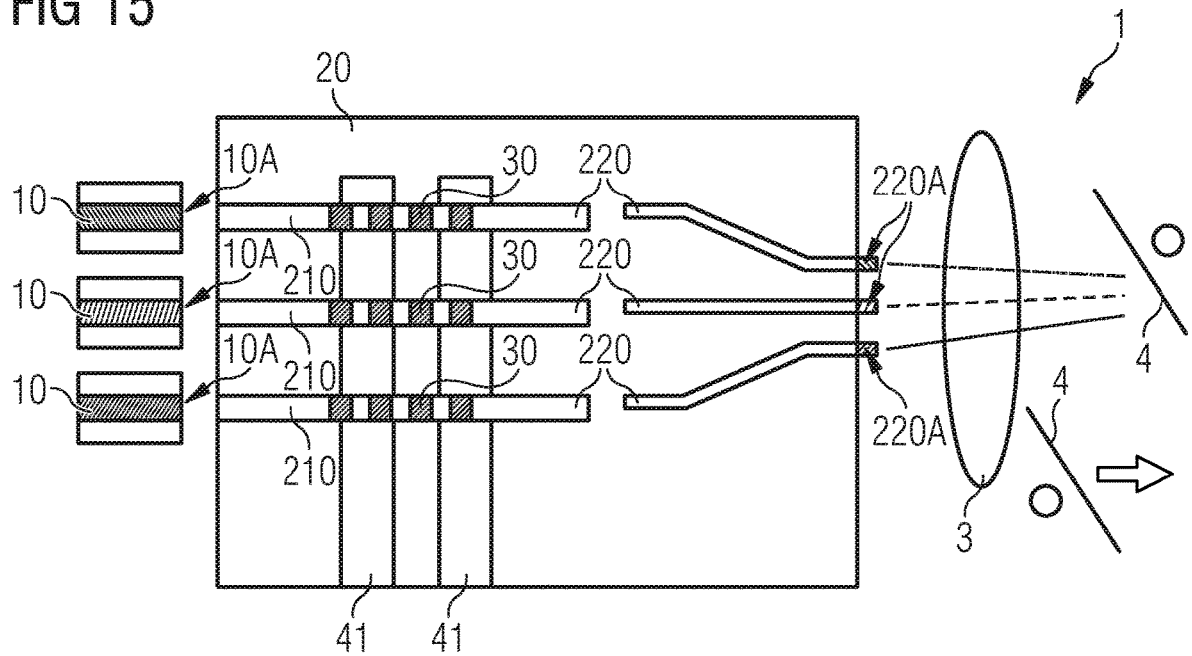
FIG. 15 shows a schematic plan view of an optoelectronic module described herein according to a fifteenth exemplary embodiment.

FIG. 15 illustrates a schematic plan view of an optoelectronic module 1 according to the fifteenth exemplary embodiment. The fifteenth exemplary embodiment essentially corresponds to the seventh exemplary embodiment. In addition to the seventh exemplary embodiment, a collimation optic 3 and a plurality of mirrors 4 are arranged downstream of the photonic chip 2. The secondary electromagnetic radiation which is coupled out of the output facets 220A is further collimated by the collimation optic 3 and afterwards deflected by the mirrors 4. The mirrors 4 may be pivotable in at least one axis to achieve a deflection of the collimated secondary electromagnetic radiation in a desired direction. Such an arrangement may be particularly suitable for use in a projection device.

Figure 16:
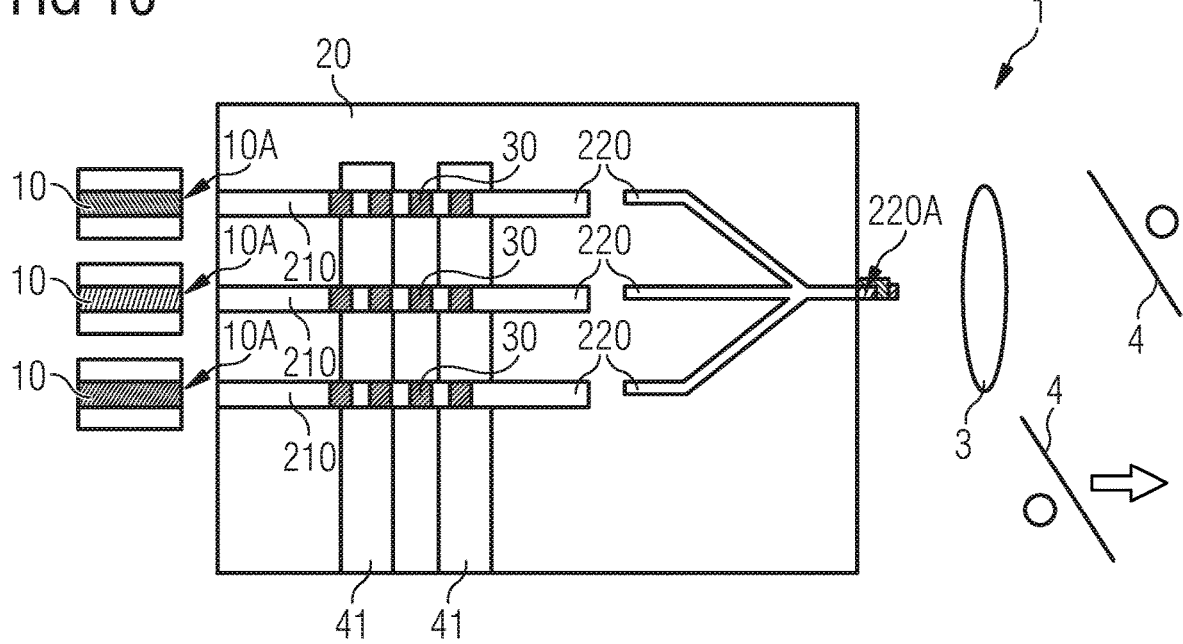
FIG. 16 shows a schematic plan view of an optoelectronic module described herein according to a sixteenth exemplary embodiment.

FIG. 16 describes a schematic plan view of an optoelectronic module 1 according to the sixteenth exemplary embodiment. The sixteenth exemplary embodiment essentially corresponds to the eighth exemplary embodiment. In addition to the eighth exemplary embodiment, a collimation optic 3 and a plurality of mirrors 4 are arranged downstream of the photonic chip 20. The second waveguide 220 is formed as a beam combiner which couples the secondary electromagnetic radiation of all semiconductor lasers 10 in a common waveguide.

The secondary electromagnetic radiation which is coupled out of the output facet 220A of the common waveguide is further collimated by the collimation optic 3 and afterwards deflected by the mirrors 4. The mirrors 4 may be pivotable in at least one axis to achieve a deflection of the collimated secondary electromagnetic radiation in a desired direction. Such an arrangement may be particularly suitable for use in a projection device. The use of a single output facet 220A simplifies a collimation of the secondary electromagnetic radiation and enables the use of smaller collimation optics 3 compared to the fifteenth exemplary embodiment for example.

Figure 17:
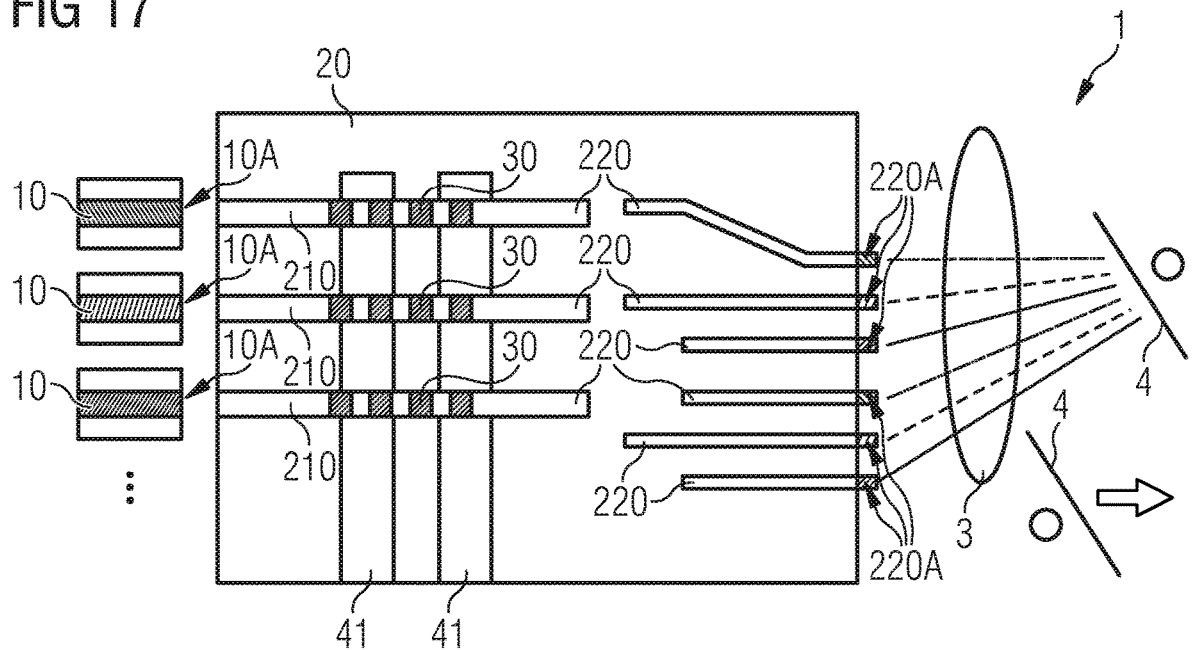
FIG. 17 shows a schematic plan view of an optoelectronic module described herein according to a seventeenth exemplary embodiment.

FIG. 17 shows a schematic plan view of an optoelectronic module 1 according to the seventeenth exemplary embodiment. The seventeenth exemplary embodiment essentially corresponds to the fifteenth exemplary embodiment. In addition to the fifteenth exemplary embodiment, an increased optical output power and/or a higher display resolution are achieved by an increased number of semiconductor lasers 10, first waveguides 210, Bragg reflectors 30 and second waveguides 220 (illustrated by dots in FIG. 17).

Figure 18:
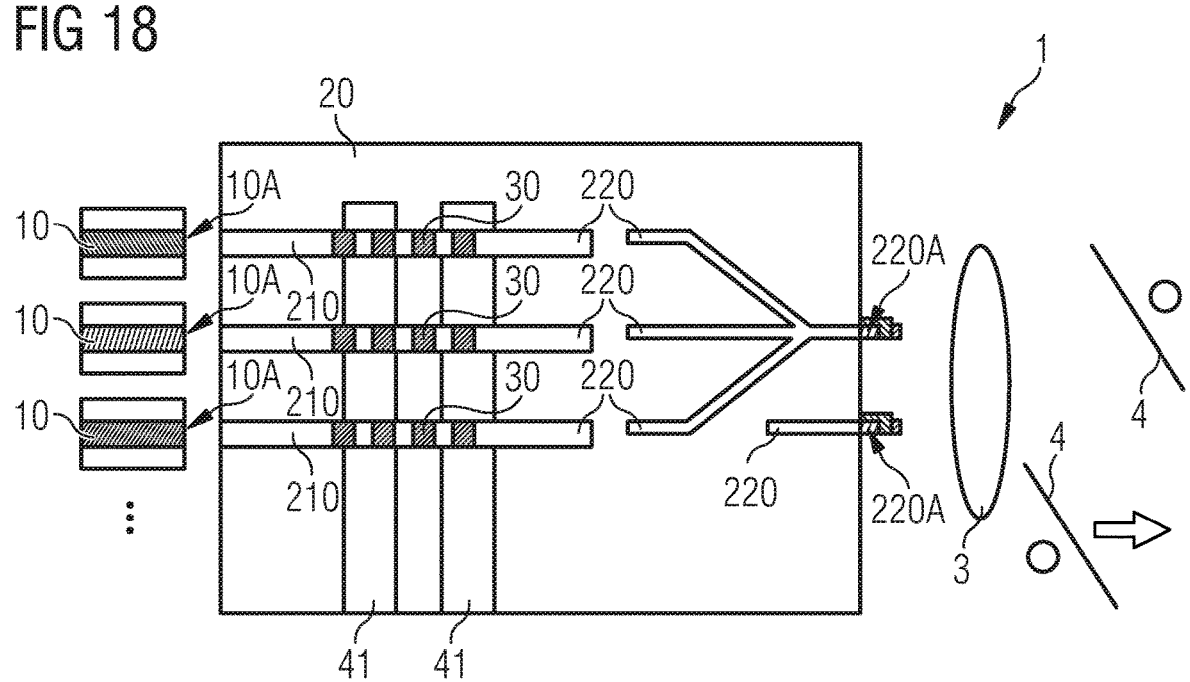
FIG. 18 shows a schematic plan view of an optoelectronic module described herein according to an eighteenth exemplary embodiment.

FIG. 18 illustrates a schematic plan view of an optoelectronic module 1 according to the eighteenth exemplary embodiment. The eighteenth exemplary embodiment essentially corresponds to the sixteenth exemplary embodiment. In addition to the sixteenth exemplary embodiment, an increased optical output power and/or a higher display resolution are achieved by an increased number of semiconductor lasers 10, first waveguides 210, Bragg reflectors 30 and second waveguides 220 (illustrated by dots in FIG. 18).

Figure 19:
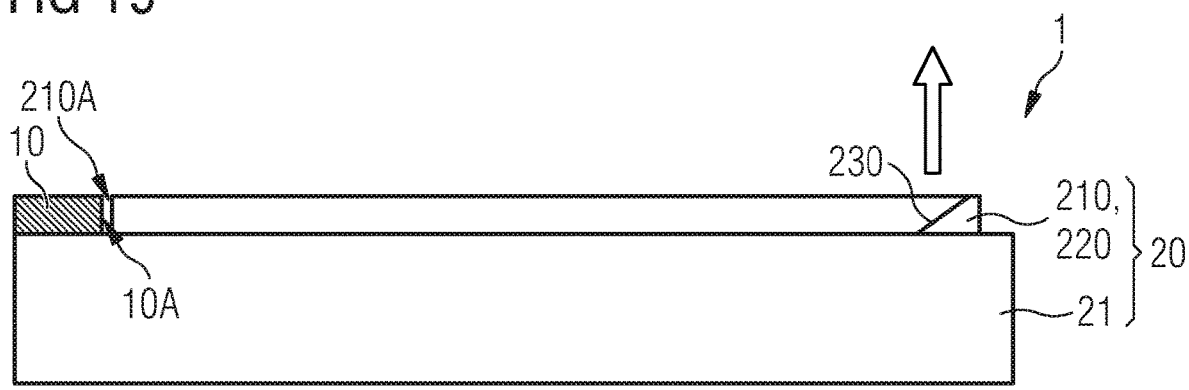
FIG. 19 shows a schematic side view of an optoelectronic module described herein according to a nineteenth exemplary embodiment.

FIG. 19 shows a schematic side view of an optoelectronic module 1 according to the nineteenth exemplary embodiment. The optoelectronic module 1 comprises a semiconductor laser 10 and a photonic chip 20. The photonic chip 20 comprises a substrate 21 which is made from glass, sapphire or silicon. Furthermore, the photonic chip 20 has a first waveguide 210 and a second waveguide 220 which are arranged on the substrate 21. The semiconductor laser 10 emits a primary electromagnetic radiation through a front facet 10A and is arranged on the photonic chip 20. The primary electromagnetic radiation is coupled into the first waveguide 210 through an incoupling facet 210A on a side face 20A of the photonic chip 20.

The photonic chip 20 comprises an optical deflector 230 which is designed to deflect the secondary electromagnetic radiation out of a main extension plane of the photonic chip 20. Preferably, the optical deflector 230 deflects the secondary electromagnetic radiation perpendicular to the main extension plane of the photonic chip 20. Thus, an additional external optical deflection element downstream of the optoelectronic module 1 can be dispensed with.

Figure 20:
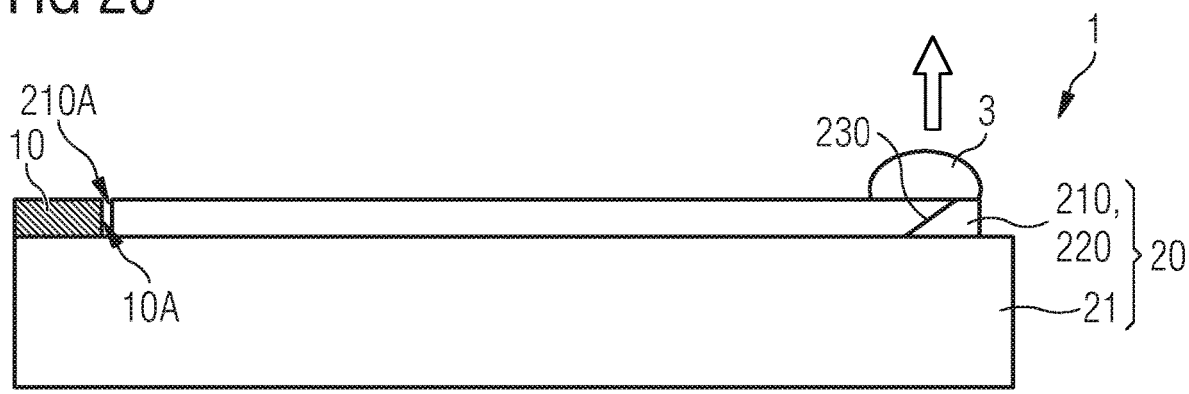
FIG. 20 shows a schematic side view of an optoelectronic module described herein according to a twentieth exemplary embodiment.

FIG. 20 illustrates a schematic side view of the optoelectronic module 1 according to the twentieth exemplary embodiment. The twentieth exemplary embodiment essentially corresponds to the nineteenth exemplary embodiment.

In addition to the nineteenth exemplary embodiment, a collimation optic 3 is arranged downstream of the optical deflector 230. The collimation optic 3 can be arranged directly on the photonic chip 20. Advantageously, no further external collimation optic 3 is necessary downstream of the optoelectronic module 1.

The invention described herein is not limited by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

LIST OF REFERENCE SIGNS 1 optoelectronic module
2 optical element
3 collimation optic
4 mirror
10 semiconductor laser
10A front facet
20 photonic chip
20A side face
21 substrate
30 Bragg reflector
41 first electrical terminal
42 second electrical terminal
43 third electrical terminal
50 coupling optic
60 optical modulator
70 optical detector
80 optical amplifier
90 filler material
100 semiconductor body
210 first waveguide
210A incoupling facet
220 second waveguide
220A output facet
230 optical deflector
D1 lateral distance

The invention claimed is:

1. An optoelectronic module comprising at least one semiconductor laser and a photonic chip, wherein
the semiconductor laser emits a primary electromagnetic radiation via a front facet of the semiconductor laser,
the primary electromagnetic radiation is coupled into the photonic chip via an incoupling facet of the photonic chip,
the photonic chip comprises at least one first waveguide, an electrical terminal, and at least one optical Bragg reflector having a reflectivity which is modulated by an electrical modulation signal applied via the terminal, and
a secondary electromagnetic radiation is coupled out of the photonic chip by means of at least one second waveguide,
wherein the secondary electromagnetic radiation has a dominant wavelength which is modulated in dependence of the electrical modulation signal.

2. The optoelectronic module according to claim 1, wherein
the front facet is covered with an antireflection coating.

3. The optoelectronic module according to claim 1, wherein the primary electromagnetic radiation has a primary spectral bandwidth and the secondary electromagnetic radiation has a secondary spectral bandwidth which is larger than the primary spectral bandwidth and which is controlled by the electrical modulation signal.

4. The optoelectronic module according to claim 1, wherein the dominant wavelength of the primary electromagnetic radiation and of the secondary electromagnetic radiation is in the visible spectral range.

5. The optoelectronic module according to claim 1, comprising a plurality of semiconductor lasers, first waveguides and Bragg reflectors, wherein a first waveguide and a Bragg reflector are assigned to each semiconductor laser.

6. The optoelectronic module according to claim 5, wherein the semiconductor lasers are monolithically integrated.

7. The optoelectronic module according to claim 5, wherein the second waveguides extend to a side face of the photonic chip and are arranged within a lateral distance of less than 10 µm to each other at the side face of the photonic chip.

8. The optoelectronic module according to claim 5, wherein the second waveguide is a beam combiner which couples the secondary electromagnetic radiation of the semiconductor lasers in a common waveguide with a common output facet.

9. The optoelectronic module according to claim 5, comprising at least three different semiconductor lasers, wherein each semiconductor laser emits primary electromagnetic radiation having a different dominant wavelength.

10. The optoelectronic module according to claim 1, wherein the semiconductor laser is arranged on the photonic chip.

11. The optoelectronic module according to claim 10, wherein a region extending from the front facet to the first waveguide is filled with a filler material which is permeable for the primary electromagnetic radiation.

12. The optoelectronic module according to claim 1, wherein the first waveguide, the second waveguide and/or the Bragg Reflector are made of one of the following materials: LiNb, ITO, SiN, SiO, liquid crystal-materials.

13. The optoelectronic module according to claim 1, wherein the first waveguide is a single mode waveguide.

14. The optoelectronic module according to claim 1, wherein the first waveguide is tapered starting from the front facet towards the Bragg reflector.

15. The optoelectronic module according to claim 1, wherein the photonic chip comprises a substrate which is made from silicon, glass or sapphire.

16. The optoelectronic module according to claim 1, wherein the photonic chip comprises at least one optical modulator downstream of the Bragg reflector.

17. The optoelectronic module according to claim 1, wherein the photonic chip comprises an optical deflector which deflects the secondary electromagnetic radiation out of a main extension plane of the photonic chip.

18. A method for operating an optoelectronic module according to claim 1, wherein
the Bragg reflector modulates the dominant wavelength of the secondary electromagnetic radiation with a modulation rate of at least 2 nm per ns.

19. A method for operating an optoelectronic module according to claim 1, wherein
the Bragg reflector modulates the dominant wavelength of the secondary electromagnetic radiation within a spectral range of at least 10 nm.

20. A Head-Mounted Display comprising an optoelectronic module according to claim 1.

21. The optoelectronic module according to claim 2, wherein the front facet has a reflectivity for the primary electromagnetic radiation of at most 10%.

22. The optoelectronic module according to claim 21, wherein the optical feedback for the semiconductor laser is dominated by the modulated reflectivity of the Bragg reflector.

* * * * *